United States Patent
Kuyel

(10) Patent No.: US 7,685,216 B2
(45) Date of Patent: Mar. 23, 2010

(54) AUTOMATIC INPUT ERROR RECOVERY CIRCUIT AND METHOD FOR RECURSIVE DIGITAL FILTERS

(75) Inventor: Turker Kuyel, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1031 days.

(21) Appl. No.: 11/389,943

(22) Filed: Mar. 27, 2006

(65) Prior Publication Data

US 2007/0011218 A1    Jan. 11, 2007

Related U.S. Application Data

(60) Provisional application No. 60/697,428, filed on Jul. 7, 2005.

(51) Int. Cl.
*G06F 17/10* (2006.01)
(52) U.S. Cl. ...................................................... 708/300
(58) Field of Classification Search .......... 708/300–322
See application file for complete search history.

(56) References Cited

U.S. PATENT DOCUMENTS

| 5,617,344 | A | * | 4/1997 | Young et al. ................. 708/313 |
|---|---|---|---|---|
| 5,736,848 | A | * | 4/1998 | De Vries et al. ............. 324/142 |
| 5,754,455 | A | * | 5/1998 | Baker et al. .................. 708/320 |
| 5,805,619 | A | | 9/1998 | Gardner et al. |
| 6,404,363 | B1 | | 6/2002 | Park et al. |
| 6,556,637 | B1 | | 4/2003 | Moriuchi |
| 6,696,886 | B1 | | 2/2004 | Ke et al. |
| 2004/0125903 | A1 | | 7/2004 | Bazes |

* cited by examiner

*Primary Examiner*—Tan V Mai
(74) *Attorney, Agent, or Firm*—John J. Patti; Wade J. Brady, III; Frederick J. Telecky, Jr.

(57) ABSTRACT

Recursive digital filter circuitry which avoids persistent unstable conditions therein provides a serial clock signal, a synchronization signal, and a serial data input to corresponding inputs of a 3-wire serial interface circuit to produce a serial clock output signal, a synchronization output signal, and a parallel data output signal which are applied to corresponding inputs of a recursive digital filter. The serial clock signal and the synchronization signal are input to an auto-reset circuit which detects a fault associated with the synchronization signal or the serial clock signal and produces a reset signal in response to detection of the fault for resetting the recursive digital filter.

20 Claims, 6 Drawing Sheets

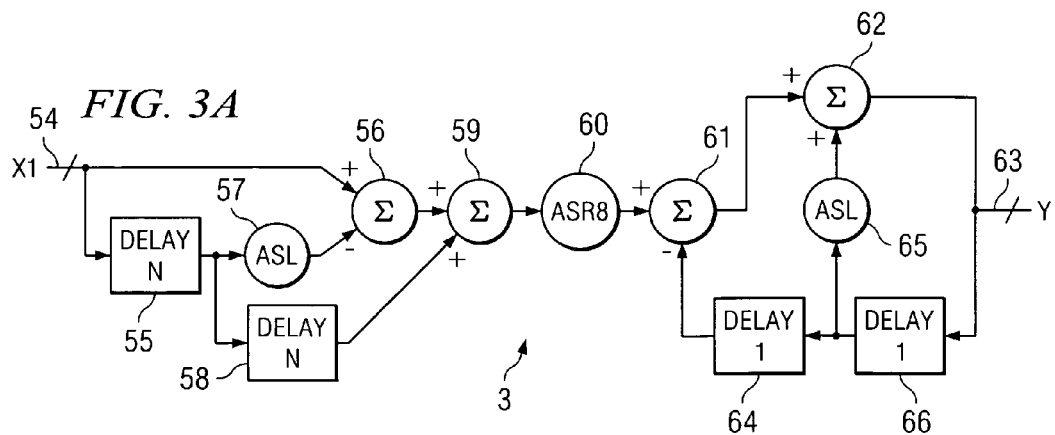
FIG. 3A
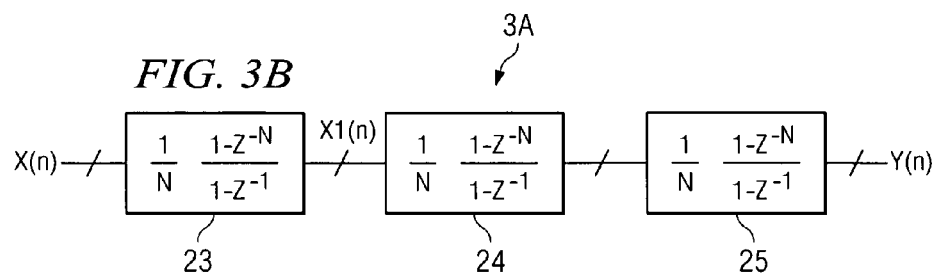
FIG. 3B
FIG. 3C

AUTOMATIC INPUT ERROR RECOVERY CIRCUIT AND METHOD FOR RECURSIVE DIGITAL FILTERS

CROSS REFERENCE TO RELATED APPLICATION

This application claims the benefit of prior filed co-pending U.S. provisional application Ser. No. 60/697,428 filed Jul. 7, 2005 entitled "Simple Automatic Input Error Recovery Circuit for Recursive Digital Over-Sampling Filters" by Turker Kuyel.

BACKGROUND OF THE INVENTION

The present invention relates generally to digital over-sampling filters that are clocked externally through the use of serial interfaces, such as the SPI interface (i.e., serial port interface). For example, the invention relates to systems including a 3-wire serial interface coupled to a recursive digital filter, and more particularly to avoiding instability of the recursive digital filter caused by input clock and data synchronization errors.

A 3-wire standard serial interface provides a simple way of submitting data to digital devices using 3 wires. FIG. 1 is a block diagram of a system 1 including a conventional 3-wire standard serial interface 2 coupled to a conventional recursive digital filter 3 that includes an external reset terminal 4. 3-wire standard serial interface 2 receives a serial data input signal SDIN, a corresponding serial clock signal SCLK, and a synchronization signal FSYNC, and in response produces a corresponding data signal PARALLEL DATA in parallel format as an input to recursive digital filter 3, and also reproduces the SCLK and FSYNC signals as inputs to recursive digital filter 3. In response, recursive digital filter 3 produces a filtered output signal OVERSAMPLED DATA in parallel format. Subsequently described FIG. 2A is a more detailed diagram of the 3-wire standard serial interface of FIG. 1, and subsequently described FIG. 3A is a more detailed diagram of a conventional recursive digital filter.

Numerical stability is critical in digital filter design, and all digital filters are designed to be stable. Finite Impulse Response (FIR) filters are inherently stable since they do not contain poles. Infinite Impulse Response (FIR) filters are stable as long as their poles lie outside the unit circle. Without stability, useful filtering action can not occur because the output of the digital filter contains unwanted oscillations which can have very high amplitudes that result in arithmetic over-flows.

Certain FIR filters are implemented recursively, similar to FIR filters. Such recursive implementations greatly simplify the hardware requirements for FIR filters. Examples of such FIR filters are over-sampling SYNC filters (i.e., COMB filters). Also, the filter stability assumes that the fundamental equation which defines the digital filter is maintained and satisfied at all times. However, various digital faults can occur in an ordinary printed circuit board environment wherein a digital over-sampling filter is controlled via a serial interface. These faults can include bit errors or synchronization errors due to ground bounce, electrical over-stresses such as those caused by electro-static discharge (ESD) events, or a "bug" in microprocessor software. Since such faults can occur with appreciable probability in some applications, it would be desirable to provide fault tolerant digital filtering, since it may be critical that the digital filter not go into a persistent unstable state after a fault condition.

There are various high-speed DAC (digital to analog converter) applications wherein a high-speed serial interface is beneficial to a parallel interface. One typical application is to provide a DAC with a parallel interface so that all bits of a digital input word are written to the DAC simultaneously. A high-speed "S" clock is used for oversampling. However, providing a DAC with the standard 3-wire SPI port and using the S clock for oversampling is not common, since most high-speed DACs have a parallel interface. But in a few applications it has been found to be advantageous to provide a high-speed DAC with a serial interface to save printed circuit board space. One application for this technique is in digital converter applications for TV systems. Some TV set manufacturers now specify use of a high-speed DAC with a serial interface rather than a parallel interface. For example, in the digital convergence unit (DCU) of some projection TV systems, six separate 16-bit DACs with serial interfaces are used to position the RGB signals correctly on the TV projection screen using available products such as the present assignee's PCM56, PCM55 or Pioneer's CD0031AM. In these digital convergence units, waveforms of up to 31.75 KHz in fundamental frequency are generated, and analog filters then are used smooth the waveforms.

A simple improvement to reduce the cost and performance requirements of the foregoing analog filters is to include a digital over-sampling filter within the DACs of the digital convergence unit. This reduces the TV manufacturer's costs associated with the analog filter. However, there are two main requirements for introducing a digital over-sampling filter into the existing TV systems. First, there is a need for the interface to be compatible with the existing 3-wire serial interface schemes (i.e., for backward compatibility with PCM56-like interfaces), and second, there is a need for ensuring stability of the digital over-sampling filter at all times, including during and after fault conditions caused by unexpected phenomena such as lightning or ESD events. If there is any kind of error or fault condition in data and/or clock synchronization, the digital filter may become unstable, and in a recursive digital filter the unstable condition ordinarily persists until the user or a microcontroller resets it. Having to reset the recursive digital filter may be very inconvenient.

FIG. 2A which shows a very basic conventional 3-wire serial interface circuit 50, which for simplicity is illustrated as an 8-bit interface (although a 16-bit serial interface circuit has been used in an actual implementation of the present invention). 8-bit, 3-wire serial interface circuit 50 includes a row of 8 D-type flip-flops 51-1,2 ... 8 and a row of 8 D-type flip-flops 52-1, 2 ... 8. The serial data signal SDIN is connected to the D input of the next of flip-flop 51-1, and its output Q is connected to the D input of flip-flop 51-2, and so on such that the output of each of flip-flops 51-2 through 51-7 is connected to the input of the next flip-flop. A serial clock signal SCLK is connected to the clock input of each of flip-flops 51-1,2 ... 8. The output of flip-flop 51-1 is connected to the D input of flip-flop 52-1, the output of flip-flop 51-2 is connected to the D input of the next flip-flop 52-2, and so on until the output of flip-flop 51-8 is connected to the D input of flip-flop 52-8. The clock inputs of flip-flops 52-1,2 ... 8 are connected to the output of an inverter 53 which has the frame synchronization signal FSYNC connected to its input. The outputs of flip-flops 52-1,2 ... 8 produce a parallel 8-bit digital word D0,D1 ... D7.

The timing diagram in FIG. 2B shows the relationship between a particular serial data word SDIN, serial clock signal SCLK and frame sync signal FSYNC, and indicates the interval of each byte of valid output data D0-D7.

In operation, the lower row of flip-flops 52-1,2 . . . 8 in effect mirrors the contents of the upper row of flip-flops 51-1,2 . . . 8, and FSYNC enables the contents of flip-flops 51-1,2 . . . 8 onto the output conductors conducting the 8-bit digital output word D0-D7.

But the digital output word D0-D7 produced by 3-wire serial interface 50 will be erroneous if, for example, there is an extra SCLK cycle. Also, if a FSYNC pulse does not arrive on time, the output D0-D7 will be erroneous. If incorrect serial data SDIN is written into 3-wire serial interface 2 as a result of an input synchronization error, the output D0-D7 will be incorrect, but as soon after correct data has been written, 3-wire serial interface 2 again begins to produce the correct parallel data output D0-D7.

If the foregoing incorrect digital output word D0-D7 is coupled to the input of recursive digital filter 3, the result is persistent, uncorrectable instability in recursive digital filter 3 which cannot be eliminated any way other than by resetting it and then entering correct serial SDIN data, and SCLK and FSYNC signals into 3-wire standard serial interface 2.

The following explanation of recursive digital filters hopefully will provide a basis for better understanding of the present invention. Recursive digital filter 3 of FIG. 1 can be a SYNC3 filter. A SYNC filter is one that performs a sine(x)/x filtering of the filter input x(n). Three SYNC filters coupled in cascade are known as a SYNC3 filter, which is said to perform a SYNC3 function or to have a "SYNC3 response". Referring to FIG. 3A, a practical hardware recursive implementation of a digital SYNC3 filter 3 of FIG. 1 is shown. As subsequently explained, digital filter 3 is actually implemented as a SYNC2 filter which, in combination with 3-wire standard serial interface 2, performs a SYNC3 function. Recursive digital filter 3 has a zero order hold input signal x1($n$) applied to a "delay by N" element 55, which delays x1($n$) by N SCLK periods. A "zero order hold" function consists simply of repeating the present input data x(n) N times. (The SYNC2 filter and the SYNC3 filters referred to can be considered to be specific examples of generalized SYNCN and SYNC(N+1) filters, respectively, where N can be an integer greater than 2.)

Zero order hold input signal x1($n$) also is applied to the (+) input of a subtractor 56. The output of delay element 55 is subjected to an arithmetic shift left (ASL) function by an arithmetic shifter 57 and the result is applied to a (−) input of subtractor 56. The output of subtractor 56 is applied to one input of an adder 59. The output of delay element 55 also is input to a delay by N element 58, the output of which is coupled to another input of adder 59. The output of adder 59 is subjected to 8 bit arithmetic shift right (ASR) operation by arithmetic shifter 60. Its output is coupled to the (+) of a subtractor 61, the output of which is applied to one input of an adder 62. The output of adder 62 is coupled to the output of digital filter 3 at which the filter output y[n] is produced. y[n] is fed back and subjected to a 1 SCLK period delay by delay element 66, the output of which is subjected to a one bit arithmetic shift left operation by arithmetic shifter 65, the output of which is coupled to the other input of adder 62. The output of delay element 66 is also subjected to a 1 SCLK delay by another delay element 64, the output of which is coupled to the (−) input of subtractor 61.

The hardware implementation of a conventional SYNC3 recursive digital filter 3 as shown in FIG. 3A can be connected to a standard 3-wire serial interface as shown in FIG. 1, wherein the SDIN (serial data input) input terminal carries the serial input data and the SCLK (serial clock) terminal serves as the continuous over-sampling clock input, and the FSYNC (frame synchronization) terminal serves as an input wherein 16-bit input data is latched at each time frame. The SYNC3 digital filtering function performed by the combination of 3-wire standard serial interface 2 and recursive digital filter 3 as shown in FIG. 3A is defined by equation:

$$H(z) = \left(\frac{1}{N}\frac{1-z^{-N}}{1-z^{-1}}\right)^3. \qquad \text{Eq. (1)}$$

The basic recursive hardware representation of the SYNC3 filter 3 is represented by the diagram of FIG. 3B, which is a time domain representation including an input x(n) applied to a first SYNC filter 23, the zero order hold output x1($n$) of which is applied to the input of a second SYNC filter 24. The output of SYNC filter 24 is applied to the input of a third SYNC filter 25. The output of the third SYNC filter 25 is the SYNC3 filtered output y[n]. This hardware implementation utilizes a zero order hold (stored in a serial-to-parallel conversion register), represented by x1($n$). The filtered output y[n] is given by the following recursion formula:

$$y[n] = \frac{1}{N^2}(x[n] - 2x[n-N] + x[n-2N]) + 2y[n-1] - y[n-2], \qquad \text{Eq. (2)}$$

where, 'n' is the time index that corresponds to oversampling serial clock signal SCLK, 'N' is the over-sampling ratio and therefore represents the time index that corresponds to frame synchronization signal FSYNC, and y[n] is the filter output signal OVER-SAMPLED DATA.

Equation (2) shows that SYNC3 filter 3 can be realized by 2 adders, 2 subtractors, and arithmetic shifters. No multipliers are required. (A non-recursive implementation of the same FIR SYNC3 filter 3 requires a convolution operation with 46 filter taps. However, the non-recursive implementation is rarely used, and it is common industry practice to use a recursive implementation of this filter.)

The recursive filter 3 implementations shown in FIGS. 3A and 3B are stable as long as filter Equation (3) is valid.

The SYNC3 implementation shown in FIG. 3B has a third order transfer function in the Z domain. In the time domain representation of FIG. 3B, it is a cascade of three SYNC filters each having the same frequency response. The easiest way to understand what that means in the time domain is to refer to the three time-based diagrams A, B and C in FIG. 3C. In diagram A, it is assumed that the input x(n) to this SYNC filter 23 includes 3 digital input words, represented by the vertical lines at FSYNC cycles 1, 2 and 3, respectively, wherein every time FSYNC goes low there is another digital input word represented by another such vertical line. The heights of the three vertical lines represent values of the three digital words. The oversampling ratio N is 4 in this simplified example. In diagram B of FIG. 3C the time base is a SCLK time frame rather than the FSYNC time frame for diagram A. In this simplified example, there are 4 SCLK cycles in each FSYNC cycle, although in a practical design there might be 16. The input data x(n) is the same for diagram B as for diagram A, so the corresponding vertical lines for diagram B are the same as for diagram A. Diagram B actually shows the sampled input waveform in the SCLK time domain.

Diagram C of FIG. 2B illustrates a zero order hold function x1($n$) that provides 4 SCLK cycles or periods per FSYNC time frame period, which in effect "pads" the input data x(n) with itself to produce the zero order hold signal x1($n$).

A convenient property of a SYNC filter is that its components can produce a zero-order hold function. So the data input signal x(n) is passed through a first SYNC filter, for example SYNC filter 23 in FIG. 3B, and the zero order hold result x1(n) is the oversampled input data illustrated in diagram C, wherein the zero order hold signal x1(n) signal is simply the result of repeating the input present data x(n) in 3-wire standard serial interface 2 until the next new data word arrives. This accomplishes the desired oversampling by N. Since the input data x(n) is already being held in 3-wire standard serial interface 2, is not necessary to provide SYNC filter 23 of FIG. 3B to provide the foregoing zero order hold function. Therefore, the input data is valid during every serial clock SCLK time frame until the next parallel input data word arrives. Therefore, to obtain a SYNC3 filter, only SYNC filters 24 and 25 in FIG. 3B actually need to be implemented. SYNC filters 24 and 25 together have a SYNC2 transfer function in the Z domain represented by the expression $$[1/N*(1-Z^{-N})/(1-Z^{-1})]^2,$$

which is the transfer function of the filter as shown in FIG. 3A. When this equation is expanded in the time domain, the result is previous Equation (2), which can be implemented by means of two adders and two subtractors and some delay elements.

The division by $N^2$ in Equation (2) is accomplished by an arithmetic right-shift, and the multiplications by 2 are accomplished by arithmetic left shifts. The indices −1 and −2 represent a delay of 1 SCLK period. The index N corresponds to a delay of N SCLK periods. An index of 2N corresponds to a delay of 2N SCLK periods. Therefore, an index N corresponds to a delay by a FSYNC period, an index of 2N represents a delay of 2 FSYNC periods, an index 2 represents a delay of 2 SCLK periods, and an index 1 represents a delay of 1 SCLK periods. The lower case "n" indexes are time indexes. The "n" indexes correspond to the SCLK periods, so if n changes, that means a new SCLK cycle has arrived.

FIG. 4 is a waveform produced by normal digital filtering by system 1 of Prior Art FIG. 1, wherein recursive digital filter 3 is a 16× over-sampling SYNC3 filter operating to smooth to a digital sine wave designated by "A". (The glitches are simulation artifacts of the simulation system by Spectre/Verilog co-simulation.) The resulting filtered output signal OVER-SAMPLED DATA designated by "B". Recursive digital filter 3 works properly as long as there are 16 SCLK cycles per each FSYNC, which is the assumed "zero faults" condition assumed for the simulated results shown in FIG. 4. The filtered output waveform "B" is a smoothed version of the digital input waveform "A" applied to recursive digital filter 3 by 3-wire standard serial interface 2 and, as indicated by A1,B1, closely follows digital input waveform "A" without causing recursive digital filter 3 to become unstable. Note that the instability in the filter actually is strongly "understated" by the simulated waveform B in FIG. 5.

Once the above-mentioned recursive filter equation for y[n] is invalidated, nothing can be done to fix the problem except to reset the recursive filter. Therefore, a feature of most recursive filter designs is an external reset switch that can be externally actuated, for example to cause a microcontroller to reset the filter if its output becomes meaningless.

FIG. 5 is a simulated waveform which illustrates the persistent instability that occurs in recursive digital filter 3 in response to an undesired 17th SCLK pulse. The simulated curves in FIG. 5 assume that the undesired 17th SCLK pulse, which is in effect an unwanted pulse superimposed (e.g., in response to an ESD event) on the normal SCLK sequence at about 10 microseconds along the horizontal time axis as indicated by vertical line "C". This causes an unexpected pulse "A1" in the digital sine wave "A" which represents the serial data SDIN, and also causes an abnormal feature "B1" in the simulated filter output waveform B, and also causes arithmetic overflow in filter 3 which results in the abnormal features "B2" and "B4" in the simulated filter output waveform "B".

The instability of digital filter 3 persists even though the input glitch (in the form of the undesired 17th SCLK pulse) occurs only once. This is because of the recursive implementation of the recursive digital filter 3.

Referring to FIG. 5, in each step of the digital sine wave "A" input to recursive filter 2 there are 16 SCLK pulses. The vertical line at the 10 μs point of the horizontal axis indicates where an unwanted SCLK pulse is "inserted" in the simulation process. The additional SCLK pulse at time C only affects one cycle of 3-wire standard serial interface 2, and that is indicated by A1 in FIG. 5. This is because 3-wire standard serial interface 2 recovers as soon as its inputs SCLK and FSYNC become correctly synchronized with SDIN, and soon thereafter the data through serial interface 3 is output correctly, as can be seen from the subsequent portion of the A waveform shown in FIG. 5. However, once the undesired 17th SCLK pulse occurs, it causes the above mentioned equation of recursive filter 3 to be violated, and therefore digital filter 3 becomes unstable and remains that way until it is reset. Feature B5 in FIG. 5, indicates that there is a divergence where waveform B no longer follows the digital input waveform A. It should be noted that in a physical implementation of filter 3, the divergence B5 actually is much more pronounced or exaggerated and appears simply as "garbage".

FIG. 6 is a simulated waveform which illustrates persistent instability that is produced in recursive digital filter 3 in response to an undesired FSYNC pulse. The simulated curves in FIG. 6 assume that the undesired FSYNC pulse, which is in effect an unwanted pulse superimposed on the normal FSYNC sequence (e.g., in response to an ESD event) at about 10 microseconds along the horizontal time axis as indicated by vertical line "C". This causes an abnormal feature "B1" in simulated filter output waveform B, and also causes the abnormal feature "B2" in the filtered output waveform "B" due to arithmetic overflow in recursive digital filter 3. This occurs even if the input data PARALLEL DATA is never read incorrectly by digital filter 3.

The instability of recursive digital filter 3 persists even though the input glitch in the form of the undesired FSYNC pulse occurs only once. The "glitch instant" is at 10 μs, and waveform A in FIG. 6 shows that the extra FSYNC glitch or pulse does not cause any error in the digital input waveform A. This is because the serial interface re-loads the current input data after the extra FSYNC pulse is inserted, so the present parallel data input to recursive filter 3 does not change. 3-wire standard serial interface 2 is not "aware" of any problem with the FSYNC signal. However, this again invalidates the filter equation, so recursive filter 3 becomes unstable, resulting in abnormal features B1, B2 and B3 in waveform B FIG. 6 and persistent instability of recursive filter 3, until it is reset.

The prior art approach to the problem of recursive filter instability is to assume that the SCLK and FSYNC pulses are always correctly synchronized with respect to the serial data SDIN, and this ordinarily is a reasonable assumption. However, in applications in which this is not a reasonable assumption it may be very inconvenient to require the user or a microcontroller to recognize the problem and reset the recursive digital filter.

Thus, there is an unmet need for an improved system including a 3-wire interface and a recursive digital filter and method that avoid persistent digital filter instability as a result of data/clock errors.

There also is an unmet need for an improved system including a 3-wire interface and a recursive digital filter and method which avoids the difficulties of the user having to actuate an external reset control of the recursive digital filter to halt persistent digital filter instability that otherwise occurs as a result of data/clock errors.

There also is an unmet need for a recursive digital filtering system including a 3-wire serial interface wherein fault-free input signals cannot be reasonably assumed.

SUMMARY OF THE INVENTION

It is an object of the present invention to provide an improved system including a 3-wire interface and a recursive digital filter and method that avoid persistent digital filter instability as a result of data/clock errors.

It is another object of the present invention to provide an improved system including a 3-wire interface and a recursive digital filter and method which avoids the difficulties of the user having to actuate and external reset control of the recursive digital filter to halt persistent digital filter instability that otherwise occurs as a result of data/clock errors.

It is another object of the invention to provide a recursive digital filtering system including a 3-wire serial interface wherein fault-free input signals cannot be reasonably assumed.

It is another object of the invention to provide a good degree of input fault tolerance for over-sampling recursive digital filters that use a 3-wire serial interface.

Briefly described, and in accordance with one embodiment, the present invention provides a recursive digital filter circuitry (10) which avoids persistent unstable conditions therein provides a serial clock signal (SCLK), a synchronization signal (FSYNC), and a serial data input (SDIN) to corresponding inputs of a 3-wire serial interface circuit (2) to produce a serial clock output signal, a synchronization output signal, and a parallel data output signal which are applied to corresponding inputs of a recursive digital filter (3). The serial clock signal and the synchronization signal are input to an auto-reset circuit (6) which detects a fault associated with the synchronization signal or the serial clock signal and produces a reset signal (ARST) in response to detection of the fault for resetting the recursive digital filter. The auto-reset circuit (6) determines whether a ratio of the frequency of the serial clock input signal to the frequency of the synchronization input signal is equal to an oversampling ratio N between the serial clock input signal (SCLK) and the synchronization signal (FSYNC) and produces the reset signal (ARST) to reset the recursive digital filter circuit (3) if the ratio is not equal to the oversampling ratio. The fault detected is associated with synchronization between the synchronization input signal (FSYNC) and the serial clock input signal (SCLK).

In the described embodiment, the invention provides auto-resetting recursive digital filter circuitry (10) including a three-wire serial interface circuit (2) receiving a serial clock input signal (SCLK), a synchronization input signal (FSYNC), and a serial data input signal (SDIN), and, in response thereto, producing a serial clock output signal, a synchronization output signal, and a parallel data output signal (PARALLEL DATA). A recursive digital filter circuit (3) is coupled to receive the serial clock output signal, the synchronization output signal, and the parallel data output signal and, in response thereto, produces a filtered over-sampled data output signal. An input fault detection circuit (6) has first and second inputs coupled to receive the serial clock input signal (SCLK) and the synchronization input signal (FSYNC), respectively, and detects a fault associated with one of the synchronization input signal (FSYNC) and the serial clock input signal (SCLK) and produces a reset signal (ARST) coupled to reset the recursive digital filter circuit (3) in response to detection of the fault.

In the described embodiment, the input fault detection circuit (6) determines whether a ratio of the frequency of the serial clock input signal to the frequency of the synchronization input signal is equal to an oversampling ratio N between the serial clock input signal (SCLK) and the synchronization input signal (FSYNC) and produces the reset signal (ARST) to reset the recursive digital filter circuit (3) if the ratio is not equal to the oversampling ratio. The input fault detection circuit (6) thereby detects the fault wherein the fault is associated with synchronization between the synchronization input signal (FSYNC) and the serial clock input signal (SCLK), and operates to produce the reset signal (ARST) if N pulses of the serial clock input signal (SCLK) fail to occur between successive pulses of the synchronization input signal (FSYNC). The reset signal (ARST) resets the recursive digital filter circuit (3) by resetting a register (55,58,64,66) of the recursive digital filter circuit (3).

In a described embodiment, the three-wire serial interface circuit (2) produces a value of the parallel data output signal (PARALLEL DATA) which is a zero order hold signal (x1(n)), and the recursive digital filter 3 includes a SYNCN filter coupled to receive the zero order hold signal (x1(n)), wherein the zero order hold signal (x1(n)) and the SYNCN filter function to provide a SYNC (N+1) filtering function.

In the described embodiment, the three-wire serial interface circuit (2) includes a first group of N flip-flops (51-1 ... 8) and a second group of N flip-flops (52-1 ... 8), an input of a first (51-1) flip-flop of the first group being coupled to receive the serial data input signal (SDIN), an output of each flip-flop of the first group except a last flip-flop (51-8) of the first group being coupled to an input of a next succeeding flip-flop of the first group, clock inputs of each of the flip-flops of the first group receiving the serial clock input signal (SCLK), outputs of each flip-flop of the first group being coupled to an input of a corresponding flip-flop, respectively, of the second group, each flip-flop of the second group being clocked in response to the synchronization input signal (FSYNC), outputs of the flip-flops of the second group producing the parallel data output signal (D0,1 ... 7). The input fault detection circuit (6) includes a pulse generation circuit (14,15,16,17,18) operable in response to the synchronization input signal (FSYNC) to produce an internal reset signal (RST) in response to corresponding edges successive pulses of the synchronization input signal (FSYNC), a counter circuit (28) that is operable to advance a count therein in response to each pulse of the serial clock input signal (SCLK), the counter circuit (28) being resettable in response to the internal reset signal (RST), the input fault detection circuit (6) including a decoding circuit (36,37) for recognizing whether or not N pulses of the serial clock input signal (SCLK) have occurred between successive internal reset signals (RST) and latching a state indicative of whether or not N pulses of the serial clock input signal (SCLK) have occurred between the successive internal reset signals (RST) to produce the reset signal (ARST) so as to reset the recursive digital filter (3) if N pulses of the serial clock input signal (SCLK) have not occurred between the successive internal reset signals (RST). The input fault detection circuit (6) also includes a gate circuit (42) having a first input coupled to the decoding circuit (36,37) and a second input coupled to an external reset signal (EXRST) to allow external resetting of the recursive digital filter circuit (3).

In one embodiment, the invention provides auto-resetting recursive digital filter circuitry (10) including means for applying a serial clock input signal (SCLK), a synchronization input signal (FSYNC), and a serial data input signal (SDIN) to corresponding inputs of a three-wire serial interface circuit (2) to produce a serial clock output signal, a synchronization output signal, and a parallel data output signal (PARALLEL DATA), means for applying the serial clock output signal, the synchronization output signal, and the parallel data output signal to corresponding inputs of a recursive digital filter circuit (3) to produce a filtered over-sampled data output signal, means (14-16,28,36) for monitoring the serial clock input signal (SCLK) and the synchronization input signal (FSYNC) to detect a fault associated with one of the synchronization input signal (FSYNC) and the serial clock input signal (SCLK), and means (39,37) for producing a reset signal (ARST) in response to detection of the fault and coupling the reset signal (ARST) to a reset input (4A) of the recursive digital filter circuit (3) to reset the recursive digital filter circuit (3) if a ratio of the frequency of the serial clock input signal (SCLK) to the frequency of the synchronization input signal (FSYNC) is not equal to an oversampling ratio between the serial clock signal (SCLK) and the synchronization input signal (FSYNC).

BRIEF DESCRIPTION OF THE DRAWINGS

FIG. 3A is a diagram of a hardware implementation a SYNC3 implementation of the recursive digital filter shown in block 3 of FIG. 1.

FIG. 3B is a diagram of showing the transfer functions of a basic SYNC3 filter.

FIG. 3C is a graph useful in understanding the operation of the SYNC3 filter shown in FIGS. 3A and 3B.

DETAILED DESCRIPTION OF THE PREFERRED EMBODIMENTS

As previously mentioned, digital faults may possibly occur in a system wherein a digital over-sampling filter is controlled via a serial interface. Therefore, it may be important that the system including the digital over-sampling filter have the capability of monitoring/detecting such faults to provide a way for the digital over-sampling filter to recover from such faults instead of going into a persistent instable condition.

When the previously described SYNC filter Equation (2) is invalidated, there is no mechanism guaranteeing the filter stability. There are two kinds of faults that may invalidate the above filter equation. One kind is "internal faults" that occur in the integrated circuit. Assuming that the integrated circuit passes characterization, qualification testing, and final testing, the probability of such internal faults usually is assumed to be zero and therefore is not dealt with. A second kind of fault is an "input fault". Input faults can occur due to noise associated with the printed circuit board design, an ESD event, or electrical over-stress due to other external factors (e.g., lightning). Input faults also can occasionally occur due to intermittent and difficult-to-debug software problems in the programming of microcontrollers or DSPs (digital signal processors). If input faults are intolerable in a particular application, a suitable digital filter recovery mechanism must be provided to prevent the persistent filter instability that inevitably occurs in the event of an input fault.

Figure 1:
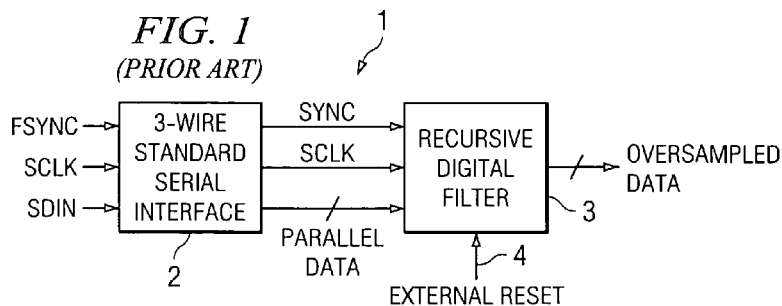
FIG. 1 is a block diagram of a prior art system including a 3-wire standard serial interface and a recursive digital filter.
Figure 2A:
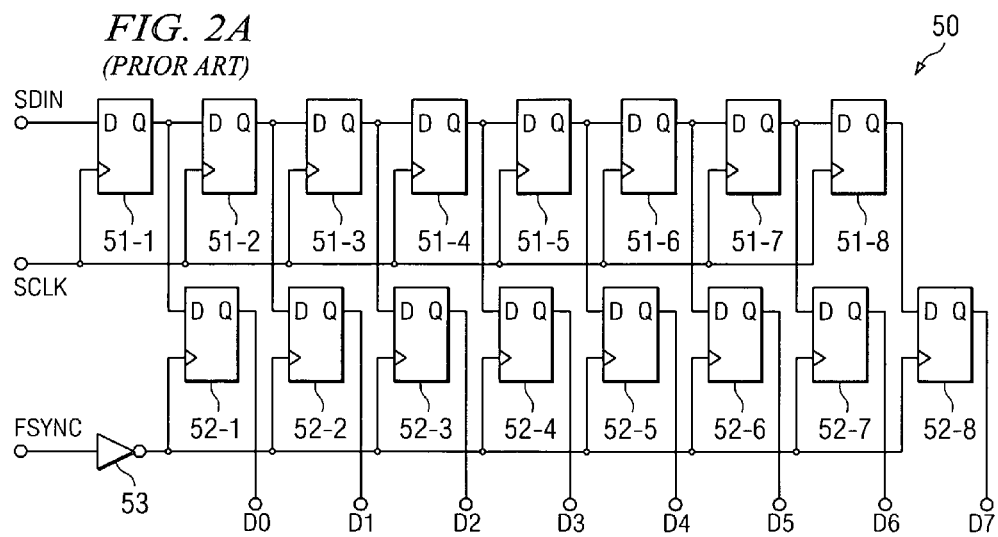
FIG. 2A is a more detailed diagram of the conventional 3-wire standard serial interface in block 2 of FIG. 1.
Figure 2B:
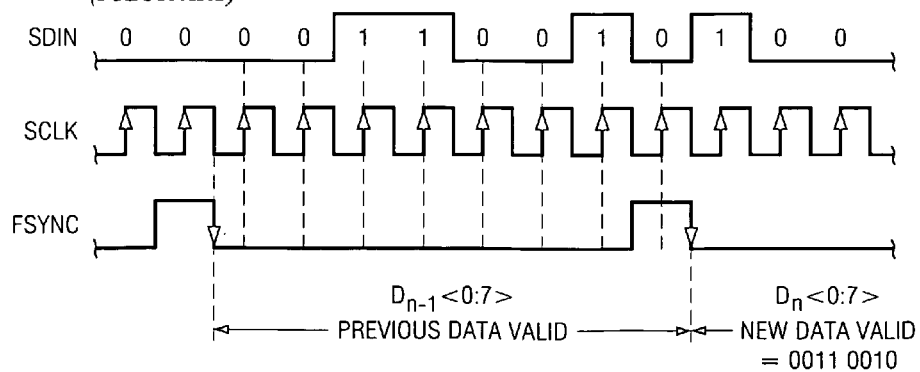
FIG. 2B is a timing diagram useful in understanding the operation of the 3-wire standard serial interface circuit shown in FIG. 2A.
Figure 4:
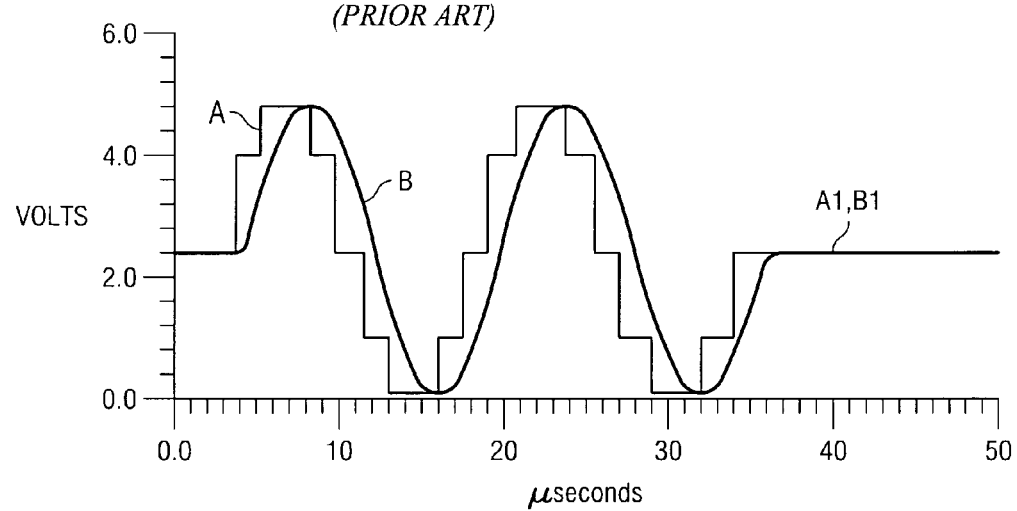
FIG. 4 is a waveform produced by normal digital filtering by the prior art system of FIG. 1.
Figure 7:
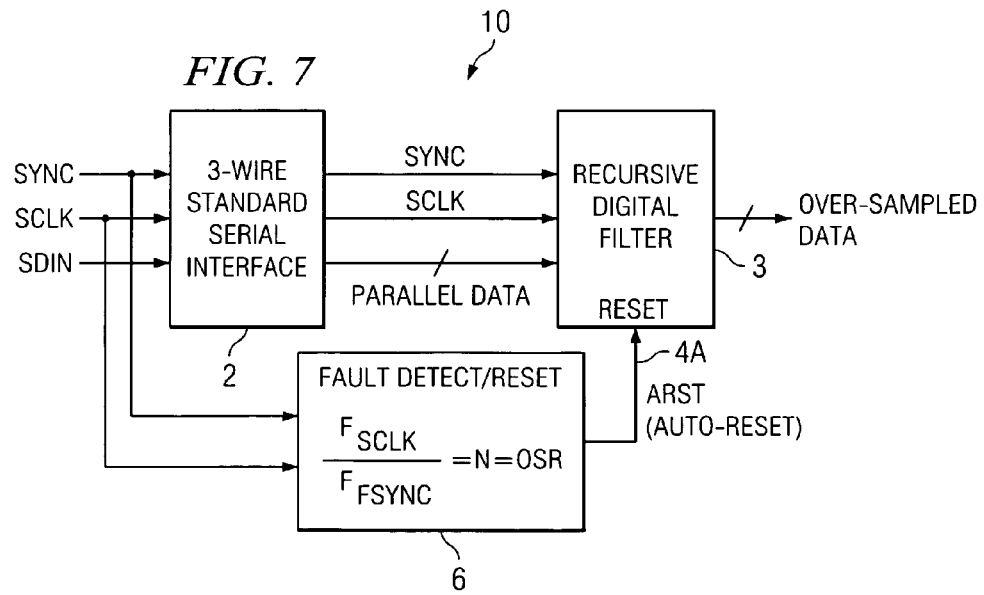
FIG. 7 is a block diagram of the present invention.

FIG. 7 shows a block diagram of an improved 3-wire serial interface system 10 according to the invention, including the same kind of conventional 3-wire standard serial interface 2 shown in Prior Art FIG. 1. The outputs of 3-wire standard serial interface 2 are coupled to corresponding inputs of a conventional recursive digital filter 3. 3-wire standard serial interface 2 receives a serial data input signal SDIN, a corresponding serial clock signal SCLK, and a synchronization signal SYNC, and in response produces a corresponding data signal PARALLEL DATA in parallel format, SCLK, and FSYNC as properly synchronized inputs to recursive digital filter 3 as in Prior Art FIG. 1, and in response, recursive digital filter 3 in FIG. 7 produces a filtered output signal OVER-SAMPLED DATA. System 10 of FIG. 7 also includes an input signal fault detect/reset circuit 6 having one input connected to FSYNC, another input connected to SCLK, and an output which automatically produces an auto-reset signal ARST if the ratio of frequencies $f_{SCLK}/f_{FSYNC}$ indicates that there are not exactly N=16 SCLK cycles between two consecutive FSYNC signals (for OSR i.e., "over sampling ratio"=OSR=N=16), that is, if the SCLK pulse count during one FSYNC period is not exactly 16. The $f_{SCLK}/fs_{YNC}$ error signal ARST is a reset signal that clears all internal registers of digital recursive filter 3 and restarts the internal clock signals. (Of course, the ratio of periods $T_{FSYNC}/T_{SCLK}$, which is equal to (and entirely equivalent to) the ratio of frequencies $f_{SCLK}/f_{FSYNC}$, could be used instead.)

Bit errors in the data stream SDIN are not considered as input faults, since digital filter 3 has no way of determining whether the received data signal PARALLEL DATA is correct. That is, SDIN faults cannot be fixed, but they are generally harmless as long as they are not persistent. For example, due to its FIR nature, the above described basic SYNC filter will recover from SDIN faults when its 46 tap impulse response convolves over the SDIN fault instant. If there is a data error such that only the serial input data SDIN is incorrect, the effect of that data error will be totally eliminated after the next 46 data words, because of the characteristics of the basic SYNC filter. This is in contrast to an input faults which actually is a synchronization error associated with FSYNC or SCLK, because such a synchronization error introduces instability into a SYNC filter that cannot be eliminated except by resetting the filter. Thus, a data error in the serial input data SDIN is not nearly as important as an synchronization error in FSYNC or SCLK because the SDIN data error will be quickly "forgotten" (i.e., after the next 46 SCLK periods), whereas the synchronization error in either FSYNC are SCLK results in persistent instability in recursive filter 3 that can only be eliminated by resetting its registers and restarting its internal clock signals.

Figure 8A:
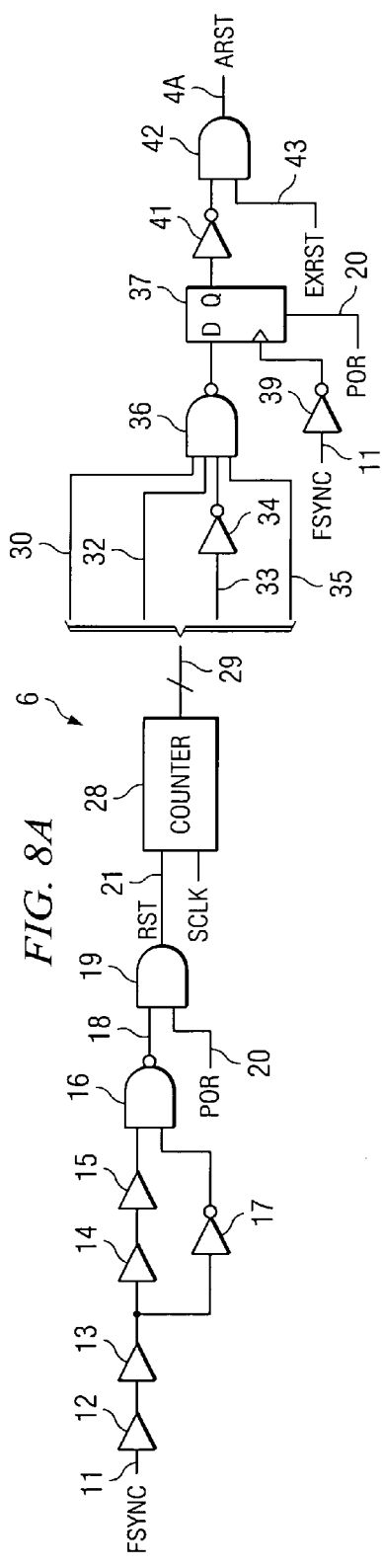
FIG. 8A is a detailed logic diagram of the fault detect/reset circuit of FIG. 7.

FIG. 8A is a detailed logic diagram of the fault detect/reset circuit 6 of FIG. 7. FSYNC is applied to an input terminal 11 of a buffer 12, the output of which is connected to the input of another buffer 13. The output of buffer 13 is connected to a pulse generator circuit including buffers 14 and 15, a NAND gate 16, an inverter 17, and an OR gate 19. The output of buffer 13 is connected to the input of buffer 14 and the input of inverter 17. The output of buffer 14 is connected to the input of buffer 15, the output of which is connected to one input of NAND gate 16. The output of inverter 17 is connected to the other input of NAND gate 16. The output of NAND gate 16 is connected by conductor 18 to one input of OR gate 19, the other input of which is coupled by conductor 20 to a signal POR (power on reset) signal.

The output of AND gate 19 produces an internal reset signal RST on conductor 21, which is connected to a reset input of a Gray code counter 28. (Counter 28 also can be implemented in various ways as a binary counter.) Counter 28 is clocked by SCLK. The output of counter 28 is a multiconductor bus 29, the conductors of which are connected to inputs 30, 32, and 35 of a NAND gate 36 and to input 33 of an inverter 34, respectively. The output of inverter 33 is connected to another input of NAND gate 36. The output of NAND gate 36 is connected to the D input of a flip-flop 37, which is clocked by the output of an inverter 39 which has its input connected by conductor 11 to FSYNC. The reset input of flip-flop 37 is connected by conductor 22 the power on reset signal POR. The Q output of flip-flop 37 is connected to the input of an inverter 41, the output of which is connected to one input of an AND gate 42, the other input of which is coupled by conductor 43 to an external reset signal EXRST. The output of AND gate 42 produces an auto-reset signal ARST which is connected by conductor 4A to the reset input of recursive digital filter 3 of FIG. 7.

Interface monitor 6 in effect monitors the synchronization between the SCLK and FSYNC signals applied to the inputs of 3-wire standard interface circuit 2. Terminal 21 generates the internal reset pulse RST every time FSYNC goes low. That generates an internal reset signal RST. Block 28 includes a glitch-free counter which gets reset by RST every time FSYNC goes low. Every time counter 28 does not store the binary number 15, the output of D-type flip-flop is either set or reset. So by the time FSYNC goes to a low level, a count to 15 is expected from counter 28. If that count up to 15 does not occur, the output of the NAND gate 36 becomes a logic "1". Flip-flop 37 only gets reset when monitor reset circuit 6 is being powered up. That is important because the complete system 10 including 3-wire standard interface 2, recursive filter 3, and fault detect/reset circuit 6 of FIG. 7 should be properly initialized when the power is turned on. FSYNC is also applied to conductor 11 at the input of inverter 39, which clocks flip-flop 37. Therefore, every time FSYNC goes low, the auto-reset signal ARST is updated accordingly, and ARST is synchronized to FSYNC. Input 43 to AND gate 42 is an external reset signal that can be actuated by a user who wants to reset the system externally.

The circuitry including blocks 12-19 is configured as a pulse generator that is triggered for each FSYNC pulse, with an inherent delay. Block 28 is a 5-bit gray code counter. Multi-input NAND gate 36 detects whether 16 SCLK pulses have been received between two successive FSYNC pulses. Flip-flop 37 stores the reset information, and is clocked by FSYNC. Flip-flop 37 is reset at each FSYNC pulse by signal RST produced by the pulse generator to ensure that a new count from 0 to 15 triggered by SCLK pulses is achieved during each FSYNC time frame or period. The external input EXRST to AND gate 42 allows the filter reset signal ARST to be generated manually. (It should be appreciated that those skilled in the art could find many ways to design the interface circuit 6 so as to attain the same result.)

Figure 8B:
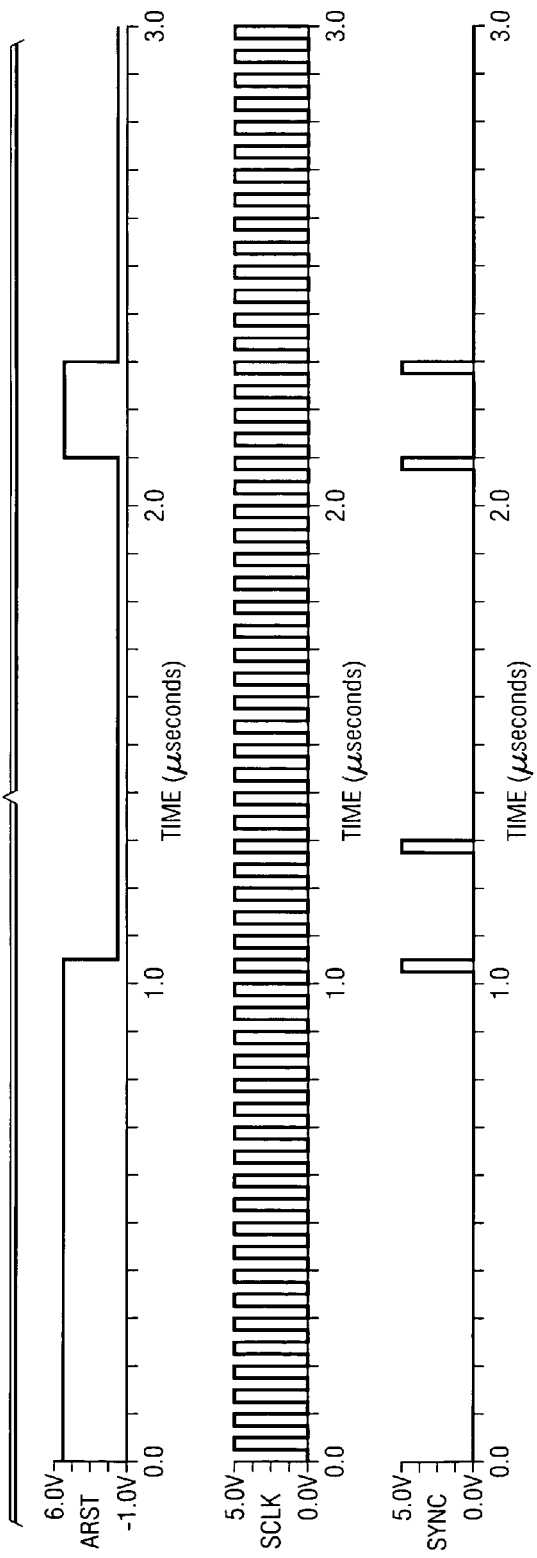
FIG. 8B includes a graph that is useful in explaining the operation of the fault detect/reset circuit of FIG. 8A.

FIG. 8B shows the waveform of the above-mentioned auto-reset pulse ARST. Interface fault detect/reset circuit 6 starts with ARST low when the first FSYNC falling edge occurs. As long as the ratio of $T_{FSYNC}/T_{SCLK}$ is not 16, ARST remains low, which resets digital filter 3. When $T_{FSYNC}/T_{SCLK}$ is equal to 16, ARST goes to a high level, which removes the reset condition from digital filter 3. When $T_{FSYNC}/T_{SCLK}$ is no longer equal to 16 thereby indicating the occurrence of an input fault, ARST goes back to its low reset level and resets the recursive digital filter 3.

Figure 9:
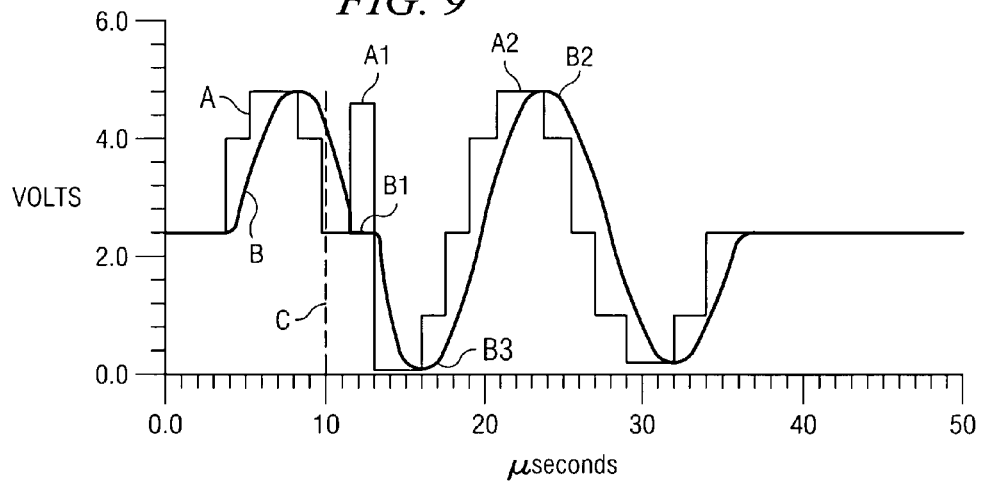
FIG. 9 is a waveform illustrating fast settling of an instability produced in the digital filter of FIG. 7 in response to an undesired 17th SCLK pulse.
Figure 10:
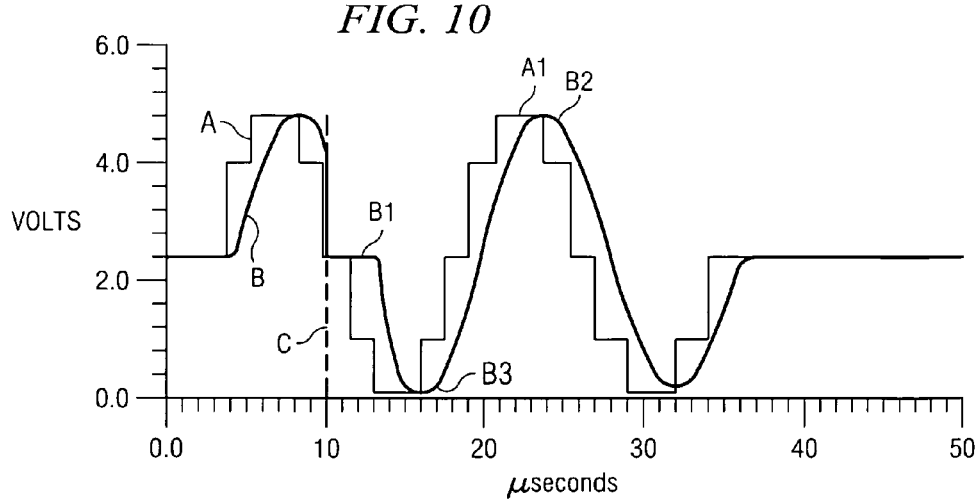
FIG. 10 is a waveform illustrating fast settling of an instability produced in the digital filter of FIG. 7 in response to an undesired FSYNC pulse.

FIGS. 9 and 10 show how the over-sampling SYNC3 filter 3 of FIG. 7 goes unstable when the number of clocks received is not exactly equal to the over-sampling ratio N.

Figure 5:
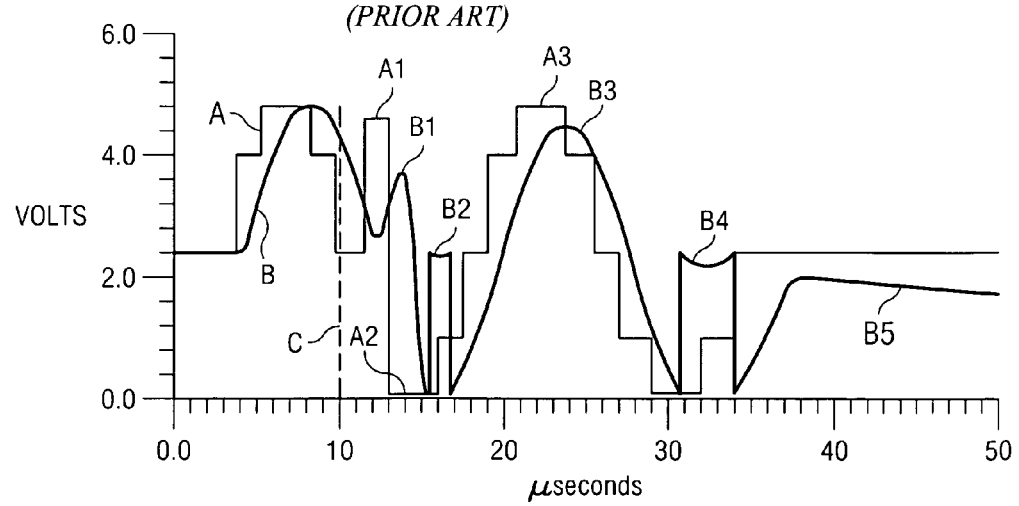
FIG. 5 is a waveform illustrating persistent instability produced in the digital filter of the prior art system of FIG. 1 in response to an undesired 17th SCLK pulse.

FIG. 9 is a waveform illustrating fast settling of an instability produced in recursive digital filter 3 of FIG. 7 in response to an undesired 17th SCLK pulse. Monitor 6 generates an auto-reset pulse for a single FSYNC frame and thereby causes recursive filter 3 to smooth various incorrect input sequences without going into persistent instability. Only one data byte of the data input stream SDIN is read incorrectly due to the undesired 17th SCLK pulse, followed by an immediate full recovery. The simulated curves in FIG. 5 assume that the undesired 17th SCLK pulse, which is in effect an unwanted pulse superimposed on the normal SCLK sequence, occurs at about 10 microseconds along the horizontal time axis as indicated by vertical line "C". This causes only an unexpected pulse "A1" in the digital sine wave "A", and an abnormal feature "B1" in the filtered output waveform "B". The instability "B2" of recursive digital filter 3 does not persist past the minimum level "B3" of filtered output waveform "B" immediately following the unexpected 17th SCLK pulse. Thus, input condition monitor circuit 6 provides fast and automatic recovery of digital recursive filter 3 from the undesired 17th SCLK pulse. This is in direct contrast to the persistent instability of recursive digital filter 3 as indicated in Prior Art FIG. 5.

Figure 6:
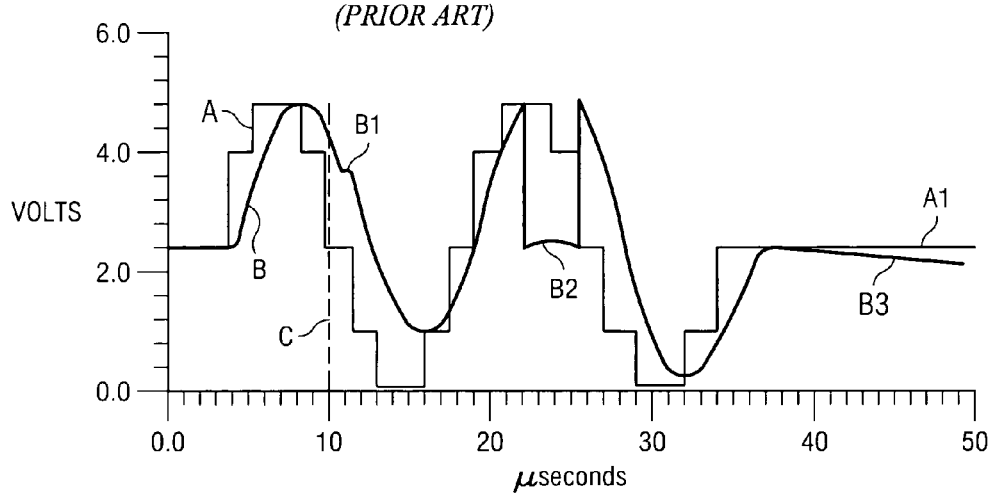
FIG. 6 is a waveform illustrating persistent instability produced in the digital filter of prior art FIG. 1 in response to an undesired FSYNC pulse.

FIG. 10 is a waveform illustrating fast settling of an instability produced in recursive digital filter 3 of FIG. 7 in response to an undesired FSYNC pulse. Monitor 6 generates an auto-reset pulse for two consecutive FSYNC frames and thereby causes recursive filter 3 to smooth various incorrect input sequences without going into persistent instability. The simulated curves "A" and "B" in FIG. 5 assume that the undesired FSYNC pulse, which is in effect an unwanted pulse superimposed on the normal FSYNC sequence, occurs at about 10 microseconds along the horizontal time axis as indicated by vertical line "C". This causes only an abnormal feature "B1" in the filtered output waveform "B", but does not affect the digital input waveform "A". The instability "B2" of recursive digital filter 3 does not persist past the minimum level "B2" of filtered output waveform "B" immediately following the unexpected FSYNC pulse. Thus, input condition fault detect/reset circuit 6 provides fast and automatic recovery of digital recursive filter 3 from the undesired FSYNC pulse. This also is in direct contrast to the persistent instability of recursive digital filter 3 as indicated in Prior Art FIG. 6.

Thus, the present invention provides a simple digital signal monitoring circuit which (1) uses a counter to make sure there are exactly 16 SCLK cycles between two consecutive FSYNC signals (for OSR=16), and (2) if the SCLK count is not exactly 16, fault detect/reset circuit 6 issues a reset signal and clears all internal registers of the recursive digital filter and restarts the internal clocks.

In operation, input signal fault detect/reset circuit 6 of FIGS. 7 and 8A continuously monitors the SCLK, FSYNC and SDIN signals and automatically generates the digital filter reset signal ARST if data integrity or synchronization errors are detected and automatically applies it to the reset input of recursive digital filter 3 if a digital input error in SCLK or FSYNC is detected. This prevents a persistent instability condition from occurring in recursive digital filter 3. The invention thereby achieves a good degree of input fault tolerance for over-sampling digital filters that use a 3-wire serial interface.

The described method and system is generally to applicable digital over-sampling filters that are clocked externally through the use of serial interfaces, such as the SPI interface. Although the described implementation is provided for a recursive over-sampling FIR filter, the same concepts apply to over-sampling IIR filters due to their recursive nature. An actual integrated circuit implementation has been fabricated and tested, and includes a 3-wire serial interface and a digital-counter-based circuit that resets the registers and clock dividers in recursive filter 3 when the there is not exactly N (i.e., OSR) SCLK cycles between two consecutive FSYNC signals.

The above described fault-tolerant circuit including a 3-wire standard serial interface circuit coupled to a recursive digital filter could be very useful for some applications in extreme environments, for example in missile applications or in space applications in which, for example, cosmic rays might cause input signal synchronization errors, where assumed stability of electronic systems is not reasonable.

Other advantages of the above described invention include circuit robustness, compatibility with existing hardware, and simplicity.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Auto-resetting recursive digital filter circuitry comprising:
a three-wire serial interface circuit receiving a serial clock input signal, a synchronization input signal, and a serial data input signal, and, in response thereto, producing a serial clock output signal, a synchronization output signal, and a parallel data output signal;
a recursive digital filter circuit coupled to receive the serial clock output signal, the synchronization output signal, and the parallel data output signal and, in response thereto, producing a filtered over-sampled data output signal; and
an input fault detection circuit having first and second inputs coupled to receive the serial clock input signal and the synchronization input signal, respectively, for detecting a fault associated with one of the synchronization input signal and the serial clock input signal and producing a reset signal coupled to reset the recursive digital filter circuit in response to detection of the fault.

2. The auto-resetting recursive digital filter circuit of claim 1 wherein the input fault detection circuit determines whether a ratio of the frequency of the serial clock input signal to the frequency of the synchronization input signal is equal to an oversampling ratio N between the serial clock input signal and the synchronization input signal and produces the reset signal to reset the recursive digital filter circuit if the ratio is not equal to the oversampling ratio.

3. The auto-resetting recursive digital filter circuit of claim 2 wherein the reset signal resets the recursive digital filter circuit by resetting a register of the recursive digital filter circuit.

4. The auto-resetting recursive digital filter circuit of claim 2 wherein the three-wire serial interface circuit produces a value of the parallel data output signal which is a zero order hold signal.

5. The auto-resetting recursive digital filter circuit of claim 1 wherein the recursive digital filter includes a SYNCN filter coupled to receive the zero order hold signal, wherein the zero order hold signal and the SYNCN filter function to provide a SYNC(N+1) filtering function.

6. The auto-resetting recursive digital filter circuit of claim 2 wherein the oversampling ratio N is equal to 16.

7. The auto-resetting recursive digital filter circuit of claim 2 wherein the three-wire serial interface circuit includes a first group of N flip-flops and a second group of N flip-flops, an input of a first flip-flop of the first group being coupled to receive the serial data input signal, an output of each flip-flop of the first group except a last flip-flop of the first group being coupled to an input of a next succeeding flip-flop of the first group, clock inputs of each of the flip-flops of the first group receiving the serial clock input signal, outputs of each flip-flop of the first group being coupled to an input of a corresponding flip-flop, respectively, of the second group, each flip-flop of the second group being clocked in response to the synchronization input signal, outputs of the flip-flops of the second group producing the parallel data output signal.

8. The auto-resetting recursive digital filter circuitry of claim 7 wherein each of the flip-flops of the first group and each of the flip-flops of the second group are D type flip-flops.

9. The auto-resetting recursive digital filter circuitry of claim 2 wherein the input fault detection circuit includes a pulse generation circuit operable in response to the synchronization input signal to produce an internal reset signal in response to corresponding edges successive pulses of the synchronization input signal, a counter circuit that is operable to advance a count therein in response to each pulse of the serial clock input signal, the counter circuit being resettable in response to the internal reset signal, the input fault detection circuit including a decoding circuit for recognizing whether or not N pulses of the serial clock input signal have occurred between successive internal reset signals and latching a state indicative of whether or not N pulses of the serial clock input signal have occurred between the successive internal reset signals to produce the reset signal so as to reset the recursive digital filter if N pulses of the serial clock input signal have not occurred between the successive internal reset signals.

10. The auto-resetting recursive digital filter circuitry of claim 9 wherein the counter is a Gray code counter.

11. The auto-resetting recursive digital filter circuitry of claim 9 wherein the input fault detection circuit includes a gate circuit having a first input coupled to the decoding circuit and a second input coupled to an external reset signal to allow external resetting of the recursive digital filter circuit.

12. The auto-resetting recursive digital filter circuitry of claim 9 wherein the corresponding edges of the successive pulses of the synchronization input signal are falling edges.

13. The auto-resetting recursive digital filter circuit of claim 1 wherein the input fault detection circuit detects the fault wherein the fault is associated with synchronization between the synchronization input signal and the serial clock input signal.

14. The auto-resetting recursive digital filter circuit of claim 1 wherein the fault is an input fault that would cause a persistent unstable condition in the recursive digital filter circuit.

15. The auto-resetting recursive digital filter circuit of claim 1 wherein the input fault detection operates to produce the reset signal if N pulses of the serial clock input signal fail to occur between successive pulses of the synchronization input signal.

16. A method of operating recursive digital filter circuitry to prevent a persistent unstable condition therein, the method comprising:
  applying a serial clock input signal, a synchronization input signal, and a serial data input signal to corresponding inputs of a three-wire serial interface circuit to produce a serial clock output signal, a synchronization output signal, and a parallel data output signal;
  applying the serial clock output signal, the synchronization output signal, and the parallel data output signal to corresponding inputs of a recursive digital filter circuit to produce a filtered over-sampled data output signal;
  monitoring the serial clock input signal and the synchronization input signal to detect a fault associated with one of the synchronization input signal and the serial clock input signal; and
  producing a reset signal in response to detection of the fault and coupling the reset signal to a reset input of the recursive digital filter circuit.

17. The method of claim 16 wherein the step of monitoring further comprises determining whether a ratio of the frequency of the serial clock input signal to the frequency of the synchronization input signal is equal to an oversampling ratio N between the serial clock input signal and the synchronization signal and producing the reset signal to reset the recursive digital filter circuit if the ratio is not equal to the oversampling ratio.

18. The method of claim 16 wherein the step of monitoring further comprises detecting a fault associated with synchronization between the synchronization input signal and the serial clock input signal.

19. The method of claim 16 including resetting the recursive digital filter circuit by resetting a register of the recursive digital filter circuit.

20. Auto-resetting recursive digital filter circuitry comprising:
  means for applying a serial clock input signal, a synchronization input signal, and a serial data input signal to corresponding inputs of a three-wire serial interface circuit to produce a serial clock output signal, a synchronization output signal, and a parallel data output signal;
  means for applying the serial clock output signal, the synchronization output signal, and the parallel data output signal to corresponding inputs of a recursive digital filter circuit to produce a filtered over-sampled data output signal;
  means for monitoring the serial clock input signal and the synchronization input signal to detect a fault associated with one of the synchronization input signal and the serial clock input signal; and
  means for producing a reset signal in response to detection of the fault and coupling the reset signal to a reset input of the recursive digital filter circuit to reset the recursive digital filter circuit if a ratio of the frequency of the serial clock input signal to the frequency of the synchronization input signal is not equal to an oversampling ratio between the serial clock signal and the synchronization input signal.

* * * * *